United States Patent
Xu et al.

(10) Patent No.: US 10,700,252 B2
(45) Date of Patent: Jun. 30, 2020

(54) SYSTEM AND METHOD OF MANUFACTURE FOR LED PACKAGES

(71) Applicant: BRIDGELUX CHONGQING CO., LTD., Yubei, Chongqing (CN)

(72) Inventors: Tao Xu, Fremont, CA (US); Hao Yin, Pleasanton, CA (US)

(73) Assignee: BRIDGELUX CHONGQING CO., LTD., Yubei (CN)

(*) Notice: Subject to any disclaimer, the term of this patent is extended or adjusted under 35 U.S.C. 154(b) by 0 days.

(21) Appl. No.: 15/952,783

(22) Filed: Apr. 13, 2018

(65) Prior Publication Data

US 2018/0301610 A1    Oct. 18, 2018

Related U.S. Application Data

(60) Provisional application No. 62/486,908, filed on Apr. 18, 2017.

(51) Int. Cl.
| | |
|---|---|
| *H01L 33/64* | (2010.01) |
| *H01L 33/50* | (2010.01) |
| *H01L 33/56* | (2010.01) |
| *H01L 33/62* | (2010.01) |

(52) U.S. Cl.
CPC ........... *H01L 33/642* (2013.01); *H01L 33/50* (2013.01); *H01L 33/505* (2013.01); *H01L 33/56* (2013.01); *H01L 33/62* (2013.01); *H01L 2933/005* (2013.01); *H01L 2933/0041* (2013.01); *H01L 2933/0066* (2013.01); *H01L 2933/0075* (2013.01)

(58) Field of Classification Search
None
See application file for complete search history.

(56) References Cited

U.S. PATENT DOCUMENTS

| | | | | |
|---|---|---|---|---|
| 9,893,230 B2* | 2/2018 | Reiss | ................... | H01L 33/0095 |
| 2001/0036506 A1* | 11/2001 | Yamamoto | ............ | C04B 35/581 |
| | | | | 427/230 |
| 2002/0079837 A1* | 6/2002 | Okazaki | ................... | H01L 33/54 |
| | | | | 313/512 |
| 2003/0016710 A1* | 1/2003 | Komoto | ............. | H01S 5/02208 |
| | | | | 372/36 |
| 2005/0062403 A1* | 3/2005 | Odaki | ................ | C09K 11/7751 |
| | | | | 313/498 |
| 2010/0148196 A1* | 6/2010 | Kamada | ................... | F21K 9/00 |
| | | | | 257/98 |

(Continued)

*Primary Examiner* — Lex H Malsawma
(74) *Attorney, Agent, or Firm* — Arent Fox LLP

(57) ABSTRACT

A light emitting diode (LED) package includes an aluminum nitride (AlN) substrate, a patterned copper layer with polished portions formed on a first side of the substrate, at least one LED disposed over the polished portions of the patterned copper layer, covers incorporating one or more phosphors disposed over the LEDs, a silicone fill and dam walls. The silicone fill, which is bordered by silicone dam walls and silicone fill surfaces, is formed in between the LEDs and covers. In some embodiments, the silicone fill does not extend over the covers. The silicone fill surface and the ends of the dam walls are substantially planar with an end of the substrate. The LED package can also include a thermal pad disposed on an opposite side of the substrate. Embodiments also include methods for make the LED package.

20 Claims, 9 Drawing Sheets

(56) References Cited

U.S. PATENT DOCUMENTS

| | | | | |
|---|---|---|---|---|
| 2011/0309388 A1* | 12/2011 | Ito | .................... | H01L 33/507 |
| | | | | 257/89 |
| 2012/0019741 A1* | 1/2012 | Park | .................. | G02F 1/133603 |
| | | | | 349/62 |
| 2012/0025218 A1* | 2/2012 | Ito | .................... | H01L 33/505 |
| | | | | 257/88 |
| 2012/0153313 A1* | 6/2012 | Yokotani | ............... | H01L 33/486 |
| | | | | 257/88 |
| 2012/0184663 A1* | 7/2012 | Hamamoto | ............. | C08L 83/04 |
| | | | | 524/500 |
| 2012/0211774 A1* | 8/2012 | Harada | .................. | H01L 33/56 |
| | | | | 257/88 |
| 2013/0221509 A1* | 8/2013 | Oda | .................... | H01L 24/97 |
| | | | | 257/676 |
| 2013/0307000 A1* | 11/2013 | Ikenaga | ............... | H01L 33/486 |
| | | | | 257/91 |
| 2014/0041909 A1* | 2/2014 | Tseng | .................. | H05K 3/4644 |
| | | | | 174/257 |
| 2014/0203305 A1* | 7/2014 | Kawano | ............... | H01L 33/486 |
| | | | | 257/88 |

* cited by examiner

100

SYSTEM AND METHOD OF MANUFACTURE FOR LED PACKAGES

BACKGROUND OF THE INVENTION

Field of the Invention

The present invention generally relates to light sources that can be used in automotive applications and more particularly to light emitting diode (LED) packages that are robust and cost effective making the LED package useful for demanding applications such as automobile applications.

Background

Light Emitting Diode (LED) packages are widely being used in many lighting applications including general lighting, back lighting, signage, automobiles, and, so on. Nevertheless, the widespread use of high-power LED devices is still somewhat limited because of packaging. For example, many current LED packages cannot handle the high-power density of LED chips because of insufficient heat dissipation away from the LED dies. Insufficient heat dissipation away from the LED die limits the minimum size of the package and therefore the density of LEDs per unit area in the device. Further, insufficient heat dissipation can cause high-powered LEDs to operate at higher temperatures and run very hot which effects light output, LED efficiency, and LED reliability.

Heat dissipation problems become more serious when LED packages are placed in environments that are hot such as in automobiles. For example LED packages that are operated near an automobile engine compartment can be subject to higher temperatures than normal background temperatures, which can significantly impact LED performance. These problems can be compounded when the use of heat sinks are discouraged because of the additional weight that heat sinks add to an automobile.

Therefore, what is needed is an LED package that has improved thermal performance while being simple to use, robust, cost effective and suitable for used in demanding environments such as automobiles.

SUMMARY OF THE INVENTION

Accordingly, embodiments are directed to techniques and systems that can be used to provide an LED package that has improved thermal performance while being simple to use, robust, cost effective and suitable for used in demanding environments such as automobiles.

Embodiments include a light emitting diode (LED) package, comprising an aluminum nitride (AlN) substrate, a patterned copper layer with polished portions formed on a first side of the substrate, at least one LED disposed over the polished portions of the patterned copper layer, covers incorporating one or more phosphors disposed over the LEDs, a silicone fill and dam walls. The silicone fill is bordered by silicone dam walls and silicone fill surfaces and is formed in between the LEDs and covers. In some embodiments, the silicone fill does not extend over the covers. The silicone fill surface and the ends of the dam walls are substantially planar with a side of a substrate. The LED package can also include a thermal pad disposed on an opposite side of the substrate.

In other embodiments, an LED package includes a substrate, a patterned copper layer formed on a first side of the substrate, wherein the patterned copper layer comprises polished portions on the surface opposite the substrate, a gold layer formed on at least one polished portion of the patterned copper layer, and an LED attached to the gold layer formed on the polished portion of the patterned copper layer. The substrate can include AlN. The LED can be attached to the gold layer using AuSn. In embodiments, the LED package can further include a cover disposed over the LED, first and second silicone walls formed on two sides of the LED, a silicone fill, which does not extend over the cover, formed in between the first and second silicone walls and in between at least two LEDs. The cover can include one or more phosphors and overhang at least one side of the LED that it is disposed on. The LED package can also include a thermal pad disposed on an opposite side of the substrate.

In yet another embodiment, the silicone fill that is disposed in between at least two LEDs has a height that extends higher than the height of the two LEDs in a region between the two LEDs.

In yet another embodiment, the silicone fill that is disposed in between at least two LEDs has a height that extends lower than the height of the two LEDs in a region between the two LEDs.

In yet another embodiment, the silicone fill that is disposed in between at least two LEDs has a height that is substantially the same as the height of the two LEDs in a region between the two LEDs.

In yet another embodiment, a second thermal pad is disposed on the same side of the substrate as the first thermal pad is disposed, the second thermal pad being separated from the first thermal pad by a gap larger than 400 micrometer.

Embodiments for fabricating an LED package include providing a substrate, disposing a patterned copper layer on the substrate, wherein a portion of the patterned copper layer is polished, disposing a first LED and a second LED on the polished portion of the patterned copper layer, disposing a first cover on the first LED and a second cover on the second LED, dispensing linearly a first dam wall and a second dam wall along opposite sides of the first LED and the second LED, dispensing a silicone fill in between the first dam wall and the second dam wall and in between the first LED and second LED, and forming a first silicone fill surface that is substantially planar with a first end of the substrate by separating the LED package. The first cover and the second cover can include one or more phosphors. The first dam wall and the second dam wall can include silicone. The substrate can include aluminum nitride (AlN).

In yet another embodiment, the silicone fill is dispensed so that it does not extend over the first cover or the second cover.

In yet another embodiment, a transient voltage suppression (TVS) chip is disposed onto the patterned copper layer.

In yet another embodiment, a gold layer is formed on at least one polished portion of the patterned copper layer. In this embodiment the first LED and the second LED are disposed on the gold layer. The first LED and the second LED can be attached to the gold layer using AuSn flux. The attachment can be done using reflow bonding.

In yet another embodiment, the silicone fill is disposed in between the first LED and the second LED to a height that extends higher than the height of the two LEDs in a region between the two LEDs.

In yet another embodiment, the silicone fill is disposed in between the first LED and the second LED to a height that extends lower than the height of the two LEDs in a region between the two LEDs.

In yet another embodiment, the silicone fill is disposed in between the first LED and the second LED to a height that is substantially the same as the height of the two LEDs in a region between the two LEDs.

In yet another embodiment, at least one thermal pad is dispose on a second side of the substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Figure 1:
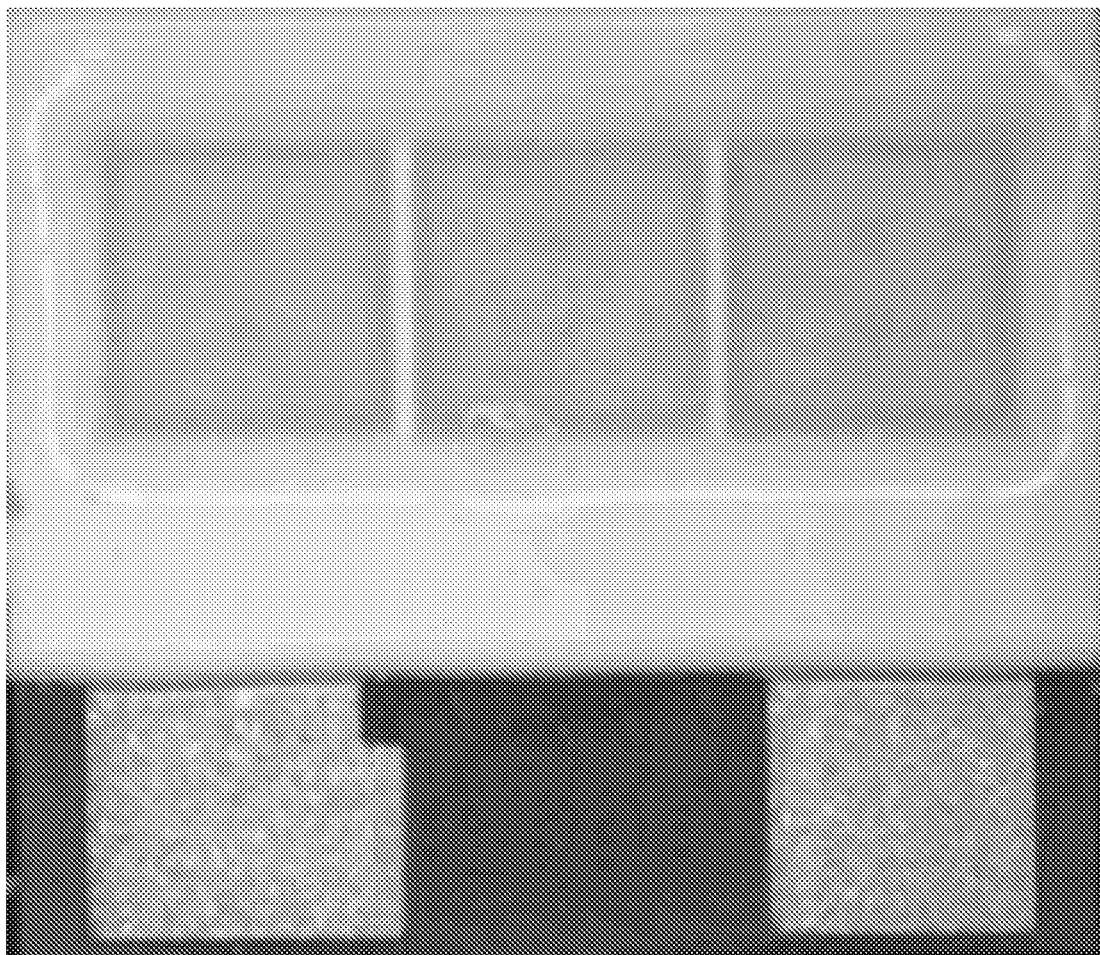
FIG. 1 is an example of an LED package having superior thermal properties and capable for use is in demanding environments such as automobiles.

Various aspects of the invention will be described herein with reference to drawings that are schematic illustrations of idealized configurations of the present invention. As such, variations from the shapes of the illustrations resulting from manufacturing techniques, tolerances, etc., are to be expected. Thus, the various aspects of the invention presented throughout this disclosure should not be construed as limited to the particular shapes of elements (e.g., regions, layers, sections, substrates, etc.) illustrated and described herein, but are to include deviations in shapes that result, for example, from manufacturing. By way of example, an element illustrated or described as a rectangle may have rounded or curved features and/or a gradient concentration at its edges rather than a discrete change from one element to another.

Furthermore, relative terms, such as "lower" or "bottom" and "upper" or "top," may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements disclosed as being on the "lower" side of other elements would then be oriented on the "upper" side of the other elements. The term "lower" can therefore encompass both an orientation of "lower" and "upper," depending on the particular orientation of the apparatus. Similarly, if an apparatus in the drawing is turned over, elements described as "below" or "beneath" other elements would then be oriented "above" the other elements. The terms "below" or "beneath" can therefore encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

Various disclosed aspects may be illustrated with reference to one or more exemplary configurations. As used herein, the term "exemplary" means "serving as an example, instance, or illustration," and should not necessarily be construed as preferred or advantageous over other configurations disclosed herein.

Furthermore, various descriptive terms used herein, such as "on" and "transparent," should be given the broadest meaning possible within the context of the present disclosure. It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. In addition, something that is described as being "transparent" should be understood as having a property that allows no significant obstruction or absorption of electromagnetic radiation in the particular wavelength (or wavelengths) of interest, unless a particular transmittance is provided. It will be further understood that when an element is referred to as being "formed" on another element, it can be grown, deposited, etched, attached, connected, coupled, or otherwise prepared or fabricated on the other element or an intervening element.

Embodiments include an LED package comprising an aluminum nitride (AlN) substrate, a patterned copper layer with polished portions formed on a first side of the substrate, at least one LED disposed over the polished portions of the patterned copper layer, covers incorporating one or more phosphors disposed over the LEDs, a silicone fill and dam walls. The silicone fill is bordered by silicone dam walls and silicone fill surfaces and is formed in between the LEDs and covers. In some embodiments, the silicone fill does not extend over the covers. The silicone fill surface and the ends of the dam walls are substantially planar with a side of the substrate. The LED package can also include a thermal pad disposed on an opposite side of the substrate.

Embodiments also include an LED package comprising a substrate, a patterned copper layer formed on a first side of the substrate, wherein the patterned copper layer comprises polished portions on the surface opposite the substrate, a gold layer formed on at least one polished portion of the patterned copper layer, and an LED attached to the gold layer formed on the polished portion of the patterned copper layer. The substrate can include AlN. The LED can be attached to the gold layer using AuSn. In embodiments, the LED package can further include a cover disposed over the LED, first and second silicone walls formed on two sides of the LED, a silicone fill, which does not extend over the cover, formed in between the first and second silicone walls and in between at least two LEDs. The cover can incorporate one or more phosphors and overhang at least one side of the LED it is disposed on. The LED package can also include a thermal pad disposed on an opposite side of the substrate. The silicone fill that is disposed in between at least two LEDs can have a height that extends higher than the height of the two LEDs in a region between the two LEDs. Alternatively, the silicone fill that is disposed in between at least two LEDs can have a height that extends lower than the height of the two LEDs in a region between the two LEDs. Alternatively, the silicone fill that is disposed in between at least two LEDs can have a height that is substantially the same as the height of the two LEDs in a region between the two LEDs. A second thermal pad can also be disposed on the same side of the substrate as the first thermal pad, the second thermal pad being separated from the first thermal pad by a gap larger than 400 micrometer.

Embodiments for fabricating an LED package include providing a substrate, disposing a patterned copper layer on the substrate, wherein a portion of the patterned copper layer is polished, disposing a first LED and a second LED on the polished portion of the patterned copper layer, disposing a first cover on the first LED and a second cover on the second LED, dispensing linearly a first dam wall and a second dam wall along opposite sides of the first LED and the second LED, dispensing a silicone fill in between the first dam wall and the second dam wall and in between the first LED and second LED, and forming a first silicone fill surface that is substantially planar with a first end of the substrate by separating the LED package. The first cover and the second cover can include one or more phosphors. The first dam wall and the second dam wall can include silicone. The substrate can include aluminum nitride (AlN). The silicone fill can be dispensed so that it does not extend over the first cover or the second cover. A transient voltage suppression (TVS) chip can be disposed onto the patterned copper layer. A gold layer can be formed on at least one polished portion of the patterned copper layer. The first LED and the second LED can be disposed on the gold layer. The first LED and the second LED can be attached to the gold layer using AuSn flux. The attachment can be done using reflow bonding. The silicone fill can be disposed in between the first LED and the second LED to a height that extends higher than the height of the two LEDs in a region between the two LEDs. Alternatively, the silicone fill can be disposed in between the first LED and the second LED to a height that extends lower than the height of the two LEDs in a region between the two LEDs. Alternatively, the silicone fill can be disposed in between the first LED and the second LED to a height that is substantially the same as the height of the two LEDs in a region between the two LEDs. In additional embodiments, at least one thermal pad can be dispose on a second side of the substrate.

FIG. 1 is an example of an LED package 100 having superior thermal properties making it useful for demanding applications such as automobile applications. LED package 100 includes top electrical contacts and bottom thermal pads which improves thermal management of LED package 100 and simplifies lighting system integrations, which reduces the costs associated with lighting system assemblies. LED package 100 can further include flip chip LED that are electrically coupled to bonding pads for easy connections to power sources. Flip chip LED can be housed using a robust ceramic package, which can improve the optical and thermal properties of the entire LED package 100. The robust ceramic package can include a ceramic substrate such as aluminum nitride (AlN) or other ceramic substrate. LED package 100 can also include transient voltage suppression (TVS) chip, which allows for electrostatic discharge (ESD) protection. The top electrical contacts, bottom thermal pads, and robust ceramic packaging can improve corrosion resistance properties of LED package 100.

LED package 100 can be used in automotive applications such as for low beam headlights, high beam headlights bending headlights, daytime running lights, fog lights, and adaptive lighting (AFS). Additional details of using LED package 100 in automobiles and other applications are described herein with reference to FIGS. 8A-8D.

Figure 2:
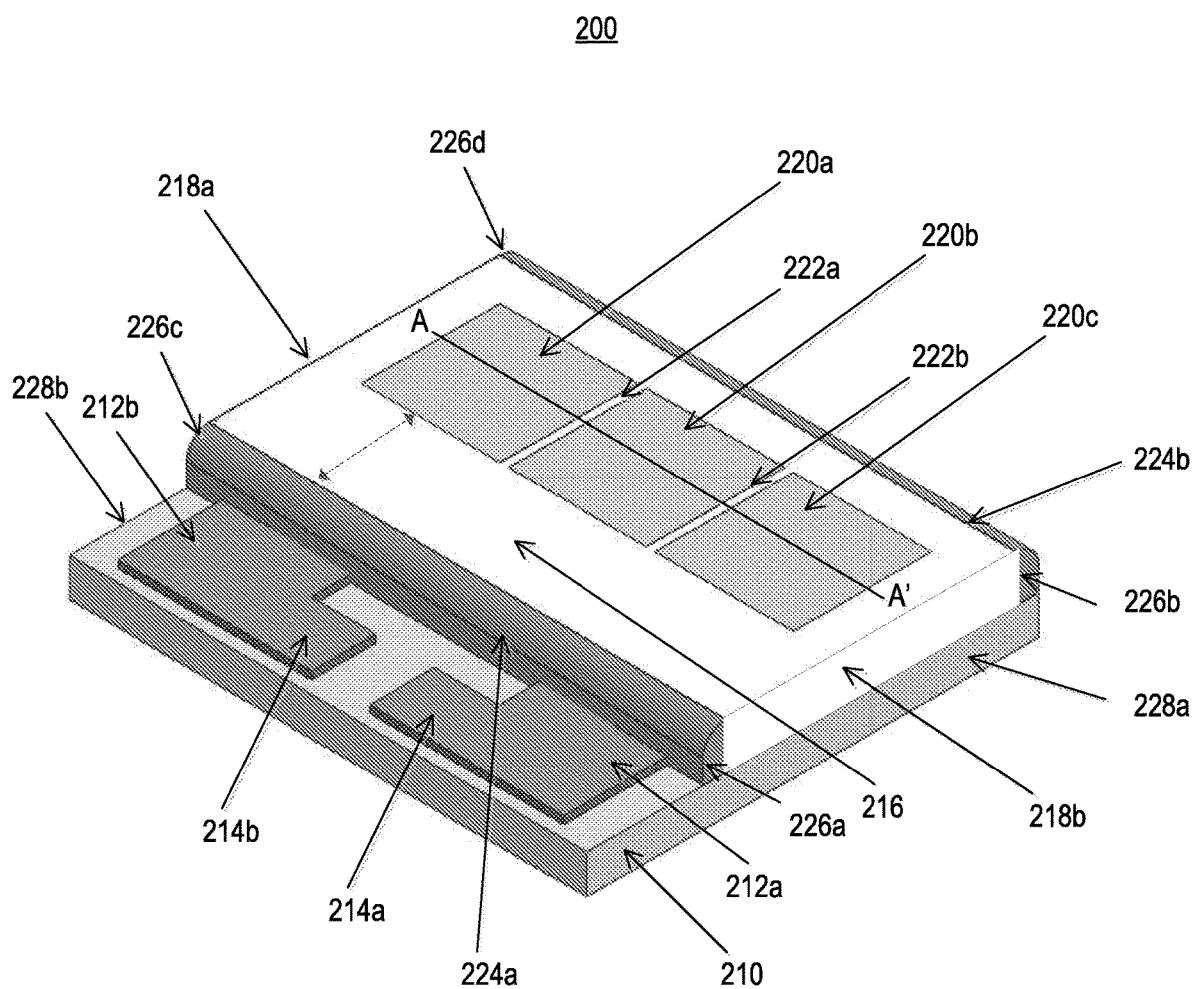
FIG. 2 is an illustration showing details of an LED package having superior thermal properties and capable for use is in demanding environments such as automobiles.

FIG. 2 is an illustration showing details of an LED package 200 having superior thermal properties and corrosion properties making it useful for use in harsher environments such as automobiles. LED package 200 includes a substrate 210, electrical connections (212a, 212b), electrical testing pads (214a, 214b), silicone fill 216, silicone fill surfaces (218a, 218b), LEDs with covers incorporating one or more phosphors (220a, 220b, 220c), gaps separating covers (222a, 222b), dam walls (224a, 224b), and dam wall ends (226a, 226b, 226c, 226d). Substrate 210 can be a ceramic substrate such aluminum nitride (AlN). Electrical connections (212a, 212b) can be a patterned copper layer formed on a first side of the substrate 210. The patterned copper layer can further include polished portions on the surface opposite the substrate 210. The electrical testing pads (214a, 214b) can be formed as part of the electrical contacts and are used to connect testing probes to the electrical contacts. In some embodiments, electrical testing pads (214a, 214b) can also be removed once testing has been completed.

A gold layer can be formed on parts of the polished portion of the patterned copper layer. Light emitting diodes are disposed over the gold layers. The gold layer is used to make a more reliable electrical connection between the light emitting diodes and the patterned copper layer. Also, the gold layer and the light emitting diodes can be formed over the polished portions of the patterned copper layer to form a more reliable electrical connection. Although LED package 200 is shown to have three light emitting diodes, those skilled in the art will realize that LED package 200 can be made with one or more LEDs. For example, LED package 200 can be made to have n LEDs linearly disposed (where n is an integer) or an array of n×m LEDs disposed (where n and m are integers). In one embodiment, there are 6 LEDs linearly disposed and in another embodiment there are 6 LEDs disposed as a 2×3 array. In some embodiments, the LEDs can be attached to the gold layer using a gold-tin (AuSn) material. In other embodiments a reflow process can be used to attach the LEDs to the gold layer.

Covers (220a, 220b, 220c) incorporating one or more phosphors are disposed over the light emitting diodes. The covers (220a, 220b, 220c) include one or more phosphors that are used to convert light from the light emitting diodes into light of different wavelengths. For example, in one embodiment the light emitting diodes emit blue light and the phosphors are used to convert the blue light into white light. In other embodiments, the light emitting diodes emit either red, blue, UV light and the phosphors are used to convert that light into white light or other frequencies. Covers (220a, 220b, 220c) incorporating phosphors can be made of materials such as ceramic, glass, or silicone. Covers (220a, 220b, 220c) incorporating phosphors are separated by gaps (222a, 22b). Covers (220a, 220b, 220c) incorporating phosphor can also be larger in area than the light emitting diodes that they are disposed over and can overhang at least one side of the light emitting diode they are disposed over.

Dam walls (224a, 224b) are formed on both sides of the light emitting diodes and the covers (220a, 220b, 220c). Dam walls (224a, 224b) are made of silicone which has been linearly dispersed and cured in place. Dam walls (224a, 224b) can also be made of high viscosity white silicone. Silicone fill 216 is dispensed in between dam walls (224a, 224b) and in between the light emitting diodes and covers (220a, 220b, 220c). Silicone fill 216 can also cured so that it is set in place. In one embodiment, dam walls (224a, 224b) are cured first and the silicone fill 216 is cured at a later time. In other embodiments, dam walls (224a, 224b) and silicone fill 216 can be cured at the same time. Further in some embodiments, silicone fill 216 can made of a lower viscosity silicone than the silicone used in dam walls (224a, 224b). Silicone fill 216 is bordered by dam walls (224a, 224b) on two sides and by silicone fill surfaces (218a, 218b) on the other two sides. The silicone fill surfaces (218a, 218b), which are formed by cutting (or singulation) the LED package 200 from other packages during the manufacturing process, is made of the same silicone as the silicone fill 216, except that it is a surface that has been cut. The cutting (or singulation process) that is used to make LED package 200 also forms dam wall ends (226a, 226b, 226c, 226d) and substrate ends (228a, 228b), both of which are the ends resulting from the cutting or singulation process. Each of the silicone fill surfaces (218a) is substantially planar with a substrate end (228a) and two of the dam wall ends (226a, 226b). As further described with reference to FIGS. 5a-5d and 6a-6c, in some embodiments, silicone fill 216 is not disposed on top of covers (220a, 220b, 220c) and can have various shapes.

Figure 3:
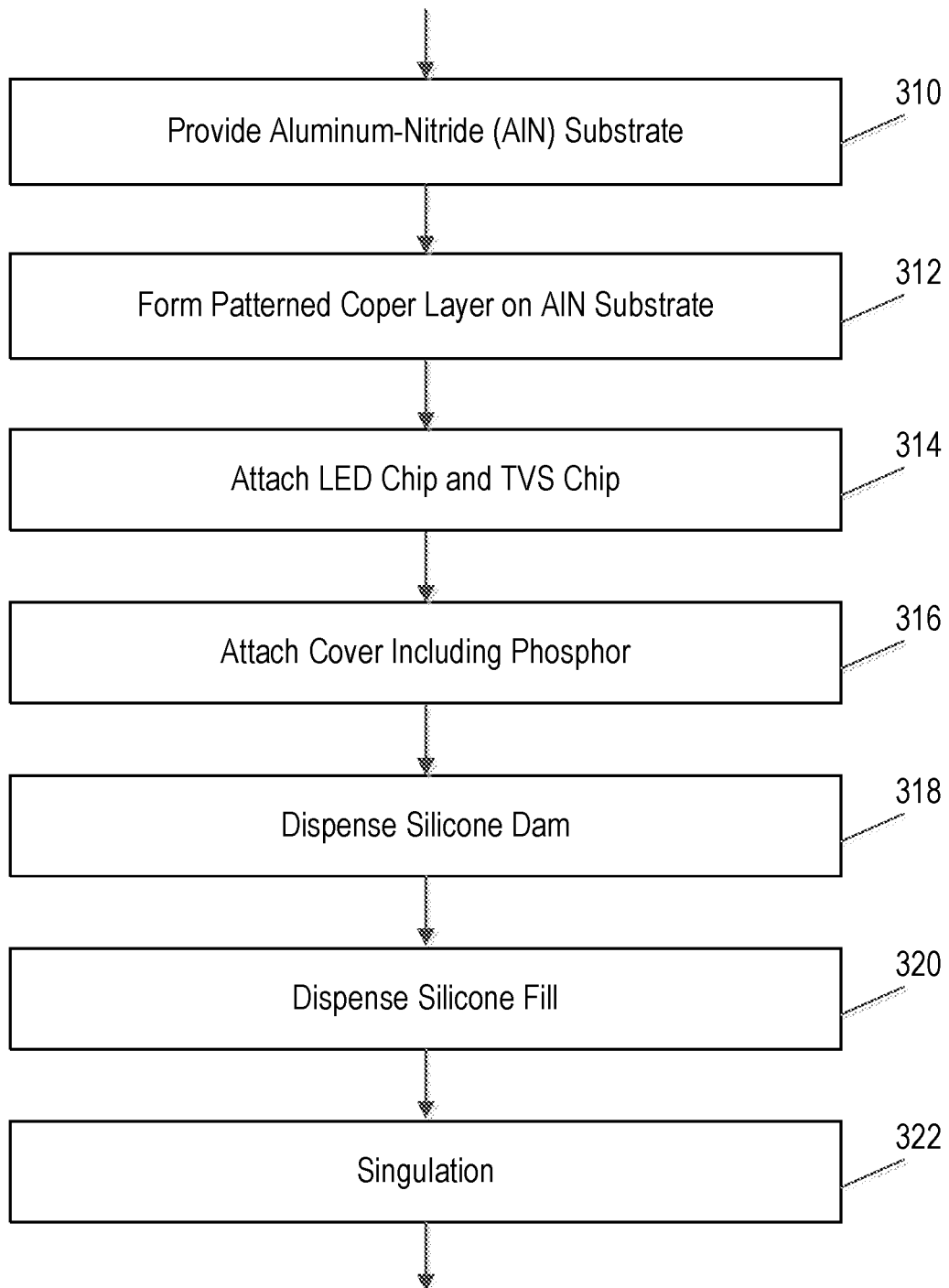
FIG. 3 is a flow chart showing techniques used to fabricate an LED package having superior thermal properties.

FIG. 3 is a flowchart illustrating techniques used to fabricate LED package 200. In operation 310, a substrate is provided. The substrate can be a ceramic substrate such as aluminum nitride (AlN). In operation 312, the electrical connections are formed on the substrate. In one embodiment, the electrical connections are a patterned copper layer that is formed on the AlN substrate. The patterned copper layer can be deposited onto the substrate using various techniques. The patterned copper layer can also have portions of it polished. In operation 314, a light emitting diode and/or transient voltage suppression (TSV) chip is attached to the patterned copper layer. In this operation, a gold layer can also be deposited onto at least the polished portion region of the patterned copper layer in the area that the light emitting diode and TSV chip will be attached. The light emitting diode and TSV chip can be attached using gold tin (AuSn) or other flux. In some embodiments, a reflow process can be used. In operation 314, the substrate and the patterned copper layer are cleaned off for contaminants such as organic contaminants, oxides etc. using etchants and/or solvents which can be (but not necessarily limited to) isopropyl alcohol (IPA), acetone, and/or phosphoric acid.

In operation 316, a cover incorporating one or more phosphors is disposed over each of the light emitting diodes. Each cover includes one or more phosphors that are used to convert light from the light emitting diodes into light of different wavelengths. For example, in one embodiment the light emitting diodes emit blue light and the phosphors are used to convert the blue light into white light. In other embodiments, the light emitting diodes emit either red, blue, UV light and the phosphors are used to convert that light into white light or other frequencies. Covers incorporating one or more phosphor can be made of materials such as ceramic, glass, or silicone. Since the covers can be larger in area than the light emitting diodes that they are disposed over, the covers can overhang at least one side of the light emitting diode they are disposed over.

In operation 318, lines of silicone are dispensed on two sides of the light emitting diodes. The silicone lines can be cured soon after being dispensed or later as an independent curing operation or as part of another curing operation. The lines of silicone are used to form dam walls for subsequent filling of additional silicone. In some embodiments the lines of silicone are viscous enough that they can support the silicone fill with or without curing. In other embodiments, the silicone lines are cured first to form rigid dam walls that are used to support the subsequently deposited silicone fill material. In operation 320, a silicone fill material is disposed in between the dam walls and in between the light emitting diodes with covers. The silicone fill can also be cured so that it is set in place. In some embodiments, the silicone fill is cured after the silicone dam walls deposited in operation 318 are cured. In other embodiments, the silicone fill is cured at the same time that the silicone dam walls deposited in operation 318 are cured. In operation 322, each LED package is singulated or separated from the other LED packages. The separation or singulation can be done by cutting the LED packages using a saw, water jet, laser or other cutting method. After singulation, the sides of the resulting LED package 200 include a substrate surface, silicone fill surface, and dam wall surfaces, which are all substantially planar.

Figure 4A:
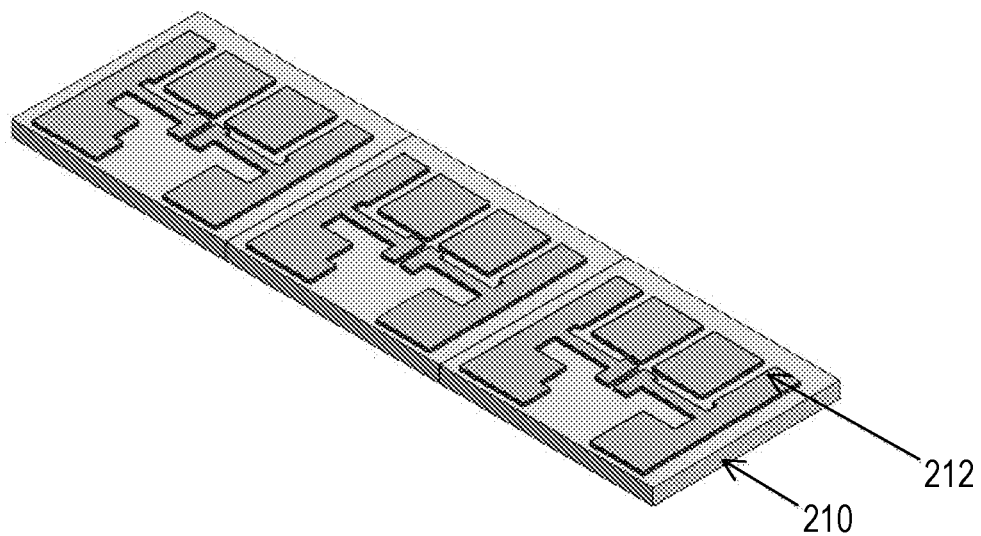
FIGS. 4A-4D illustrate details of an LED package at various times in the fabrication process.
Figure 4B:
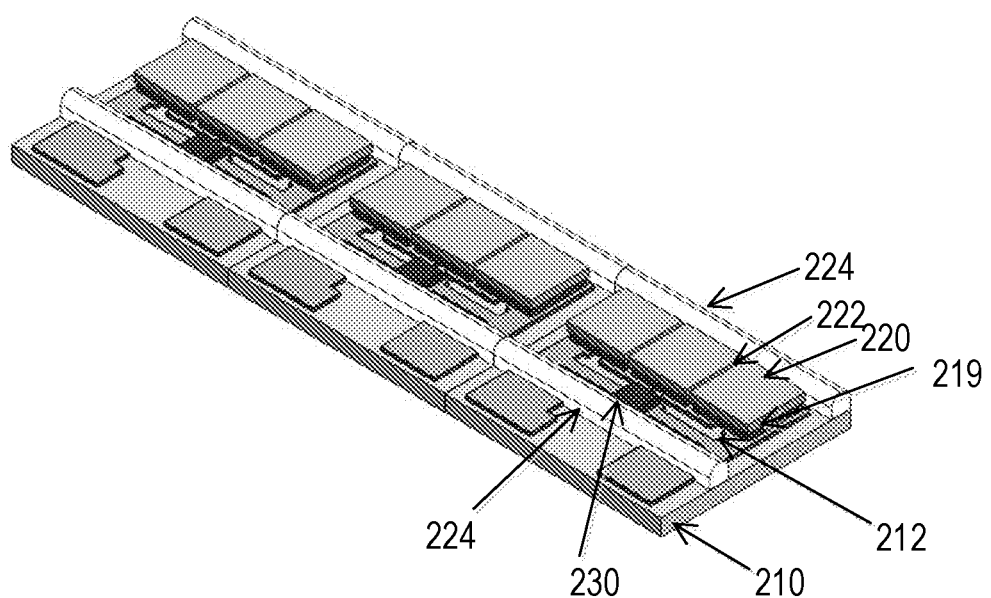
Figure 4C:
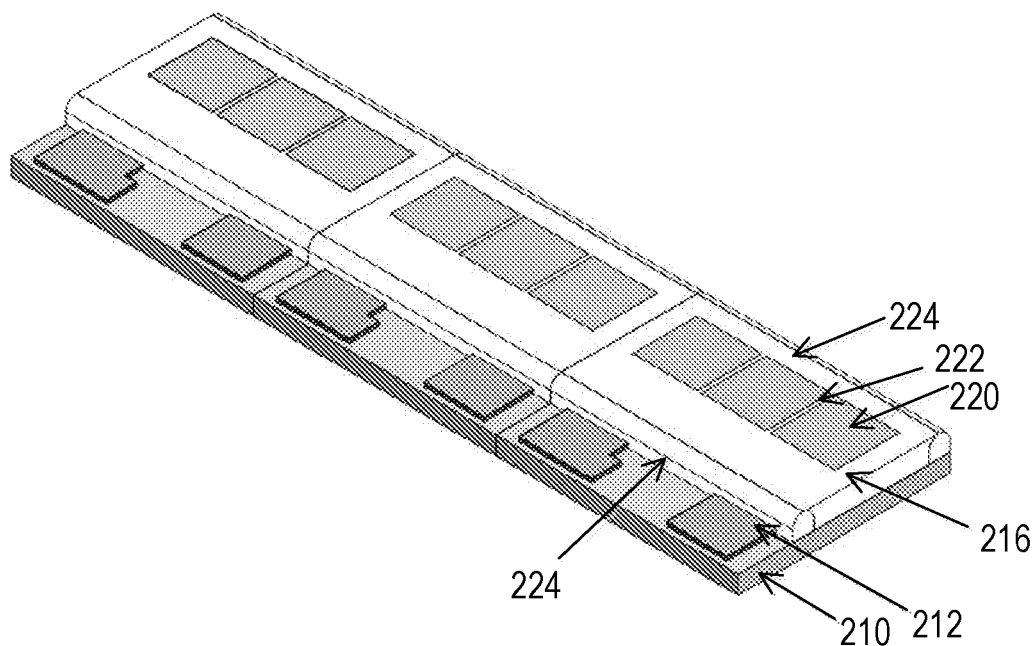
Figure 4D:
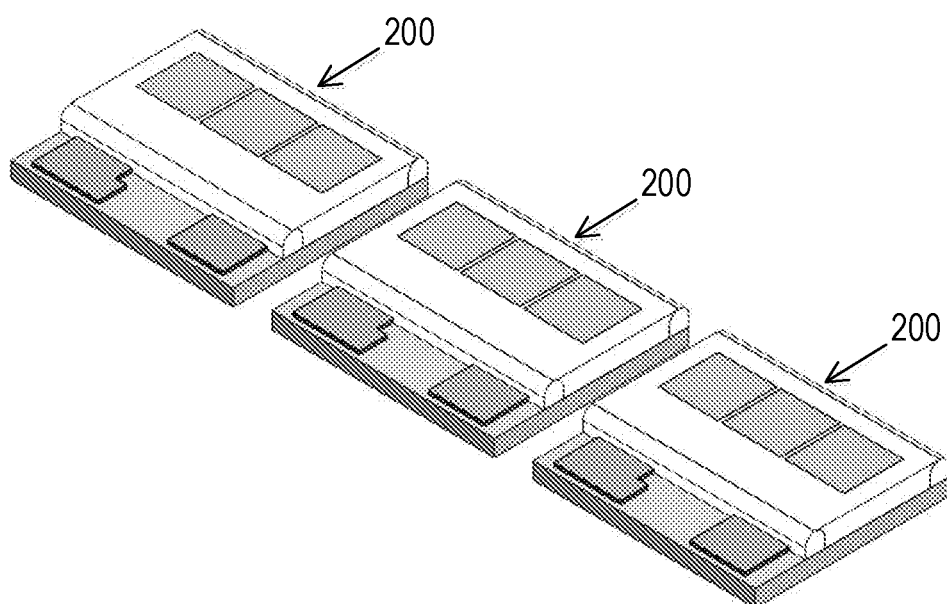

FIGS. 4A-4D illustrate details of an LED package 200 at various times in the fabrication process. FIG. 4A illustrates a substrate 210 with patterned copper layers 212 (3 sets) formed on the substrate 210. FIG. 4B illustrates a subsequent operation in the fabrication operations and includes LEDs 219 (3 on each patterned copper layer), a TSV chip 230 disposed on the patterned copper layer 212, covers 220 incorporating one or more phosphors disposed on the LEDs 219, gaps 222 separating the covers, and dam walls 224. FIG. 4C illustrates another subsequent operation in the fabrication process and includes the substrate 210, patterned copper layers 212, covers 220 incorporating one or more phosphors disposed on the LEDs, gaps 222 separating the covers, dam walls 224, and silicone fill 216. FIG. 4D illustrates three LED packages 200, after the packages have been separated (or singulated). Additional details regarding LED package 200 and the fabrication process are provided with reference to FIGS. 2-3.

Figure 5A:
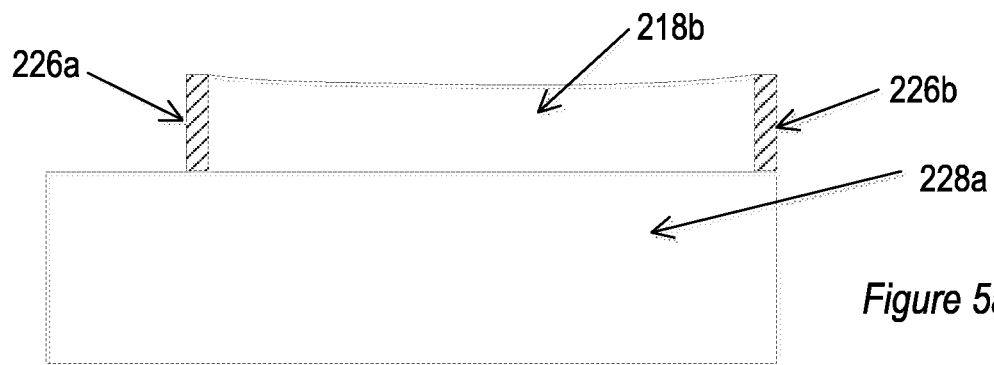
FIGS. 5A-5D are side views of an LED package having superior thermal properties for several embodiments.
Figure 5B:
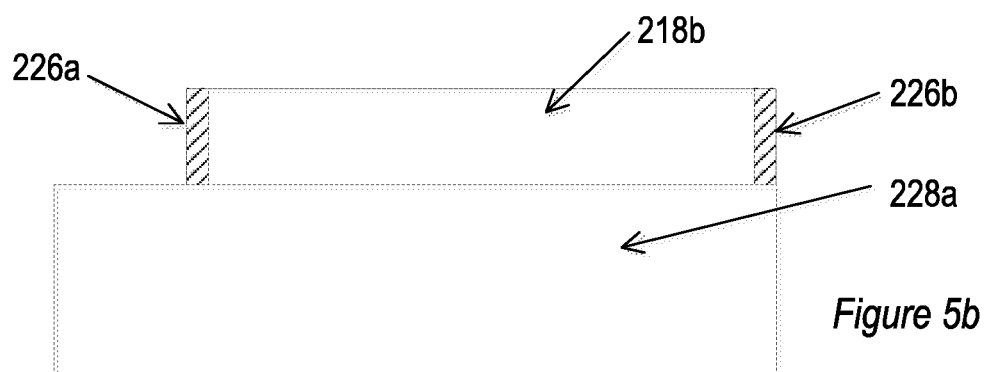
Figure 5C:
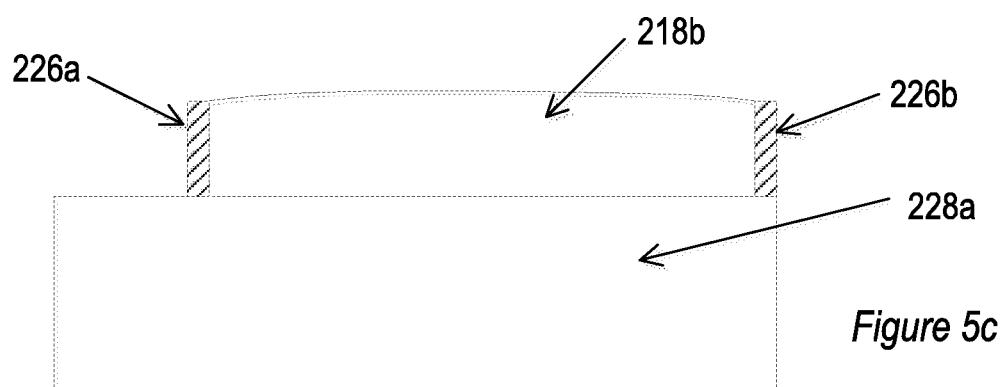
Figure 5D:
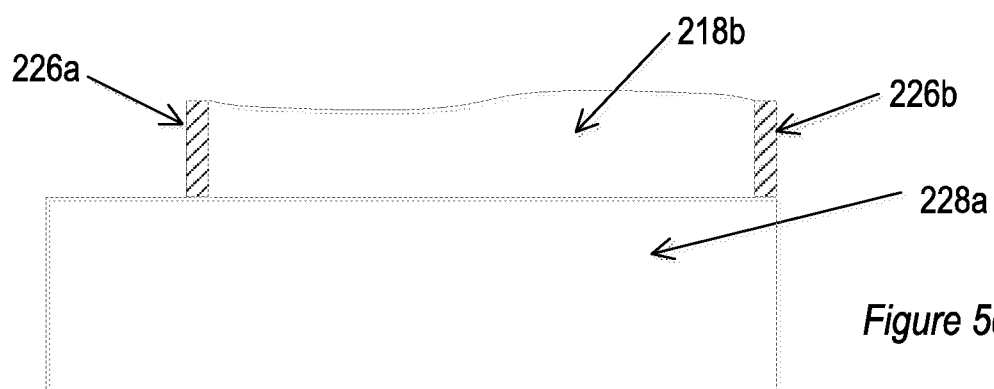

FIGS. 5A-5D are side views of LED package 200 after it has been singulated. FIGS. 5A-5D include fill surface 218b, a first dam wall end 226a, a second dam wall end 226b and a substrate end 228a. The cutting (or singulation process) that is used to make LED package 200 forms fill surface 218b, a first dam wall end 226a, a second dam wall end 226b and a substrate end 228a. Each of the fill surfaces (218a) is substantially planar with a substrate end (228a) and two of the dam wall ends (226a, 226b). FIG. 5A illustrates an embodiment where the side view of LED package 200 has a silicone fill surface 218a that is concave shaped in between first dam wall 226a and second dam wall 226b. FIG. 5B illustrates an embodiment where the side view of LED package 200 has a silicone fill surface 218a that is substantially the same as the first dam wall 226a and the second dam wall 226b. FIG. 5C illustrates an embodiment where the side view of LED package 200 has a silicone fill surface 218a that is convex shaped in between first dam wall 226a and second dam wall 226b. FIG. 5D illustrates an embodiment where the side view of LED package 200 has a silicone fill surface 218a that is a combination of concave, convex and planar shapes in between first dam wall 226a and second dam wall 226b.

Figure 6A:
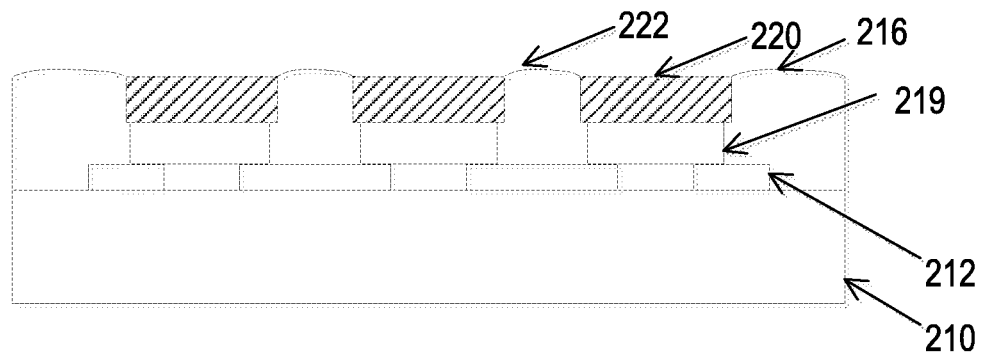
FIGS. 6A-6C are cross sectional views of the LED package illustrated in FIG. 2 along the AA' cutline.
Figure 6B:
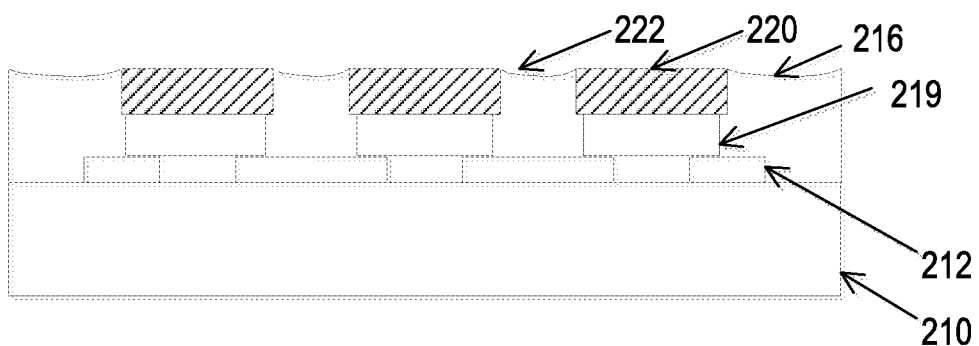
Figure 6C:
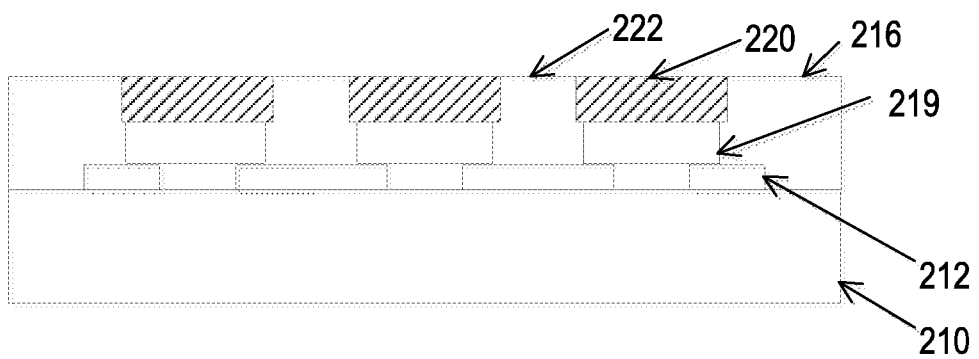

FIGS. 6A-6C are cross sectional views of the LED package 200 illustrated in FIG. 2 along the AA' cutline. The cross sections illustrated in FIGS. 6A-6C include a substrate 210, electrical connections 212, silicone fill 216, light emitting diodes (LEDs) 219, covers 220 incorporating one or more phosphors, and gaps 222 separating the covers. The covers 220 are shown to be larger than the LEDs 219 and therefore overhanging at least one side of the LEDs 219. In embodiments, the silicone fill 216 is deposited in between the dam walls and the covers but does not go on top of the covers. FIG. 6A shows the silicone fill 216 formed in the gap region 222 between the covers 220 and having a height that is higher than the tops of at least one of the covers 220. FIG. 6B shows the silicone fill 216 formed in the gap region 222 between the covers 220 and having a height that is lower than the tops of at least one of the covers 220. FIG. 6C shows the silicone fill 216 formed in the gap region 222 between the covers 220 and having a height that is substantially the same as the tops of at least one of the covers 220.

Figure 7A:
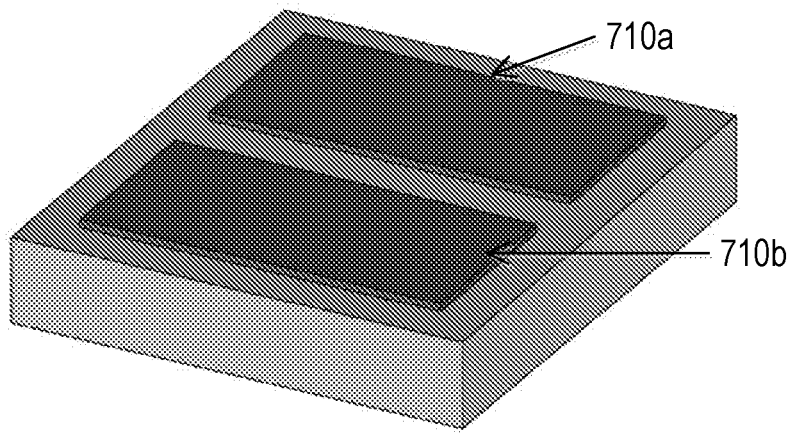
FIGS. 7A-7B illustrate the back side of an LED package showing thermal pads on the back side of the substrate.
Figure 7B:
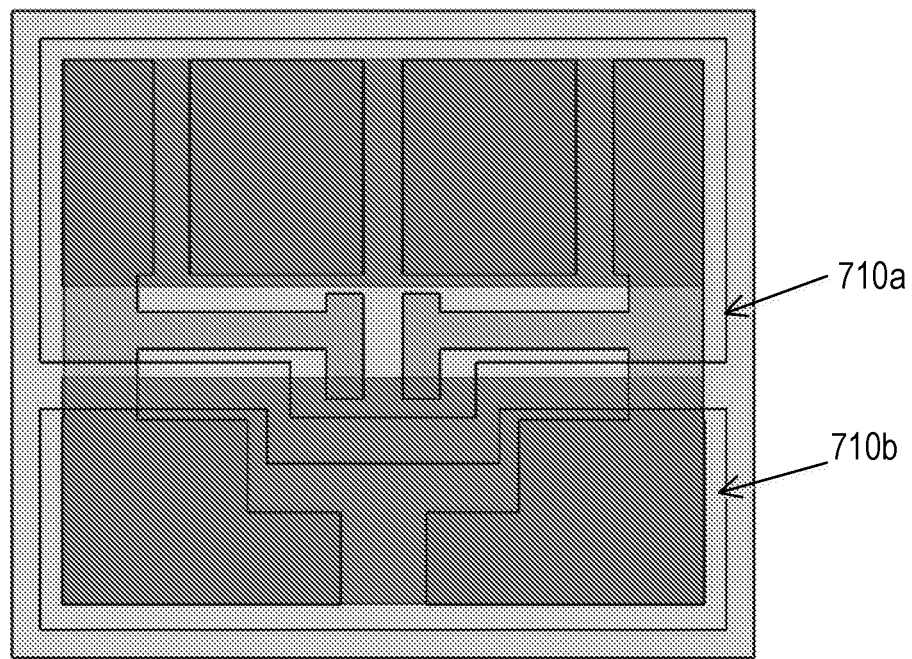

FIG. 7A illustrates the thermal pads (710a, 710b) disposed on the back side of LED package 200. The thermal pads (710a, 710b) are disposed on the side of the substrate 210 that is opposite the side of substrate 210 having the patterned copper layer. In some embodiments, the thermal pads (710a, 710b) can be separated by a gap larger than 400 micrometer. FIG. 7B illustrates the metal overlay of the thermal pads (710a, 710b) and the patterned copper layer disposed with LED package 200.

Figure 8A:
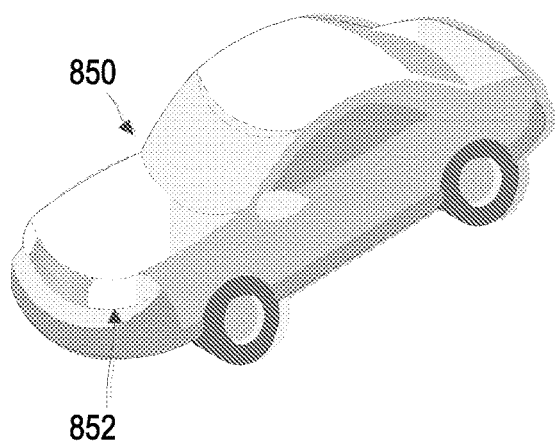
FIGS. 8A-8D are side view illustrations of various exemplary apparatuses having a light-emitting device.
Figure 8B:
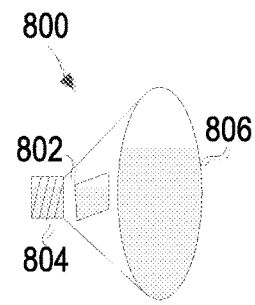

FIG. 8A is a perspective view illustrating an exemplary automobile 850 incorporating LED package 200. LED package 200 can be used for an automobile's headlights 852 in applications such as low beam headlights, high beam headlights bending headlights, daytime running lights, fog lights, and adaptive lighting (AFS). LED package 200 can also be used in other parts of an automobile 850 such as brake lights, turn signals, engine compartment lights, interior lights, truck lights, and, so on. FIG. 8B is a side view illustration of an exemplary apparatus 800 having a light-emitting device 802. The light-emitting device 802 may be located in a housing 806. The light-emitting device 802 may receive power via a power connection 804. The light-emitting device 802 may be configured to emit light. Description pertaining to the process by which light is emitted by the light-emitting device 802 is provided with reference to FIGS. 1-7.

Figure 8C:
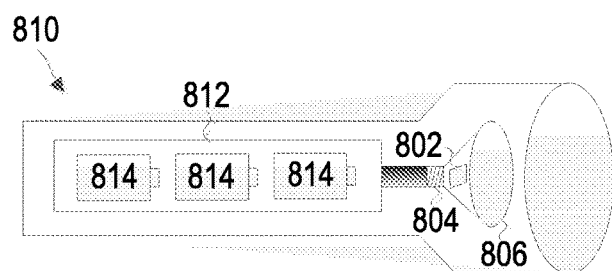

FIG. 8C is a side view illustration of a flashlight 810, which is an exemplary embodiment of an apparatus having the light-emitting device 802. The light-emitting device 802 may be located inside of the housing 806. The flashlight 810 may include a power source. In some exemplary embodiments, the power source may include batteries 814 located inside of a battery enclosure 812. The power connection 804 may transfer power from the power source (e.g., the batteries 814) to the light-emitting device 802.

Figure 8D:
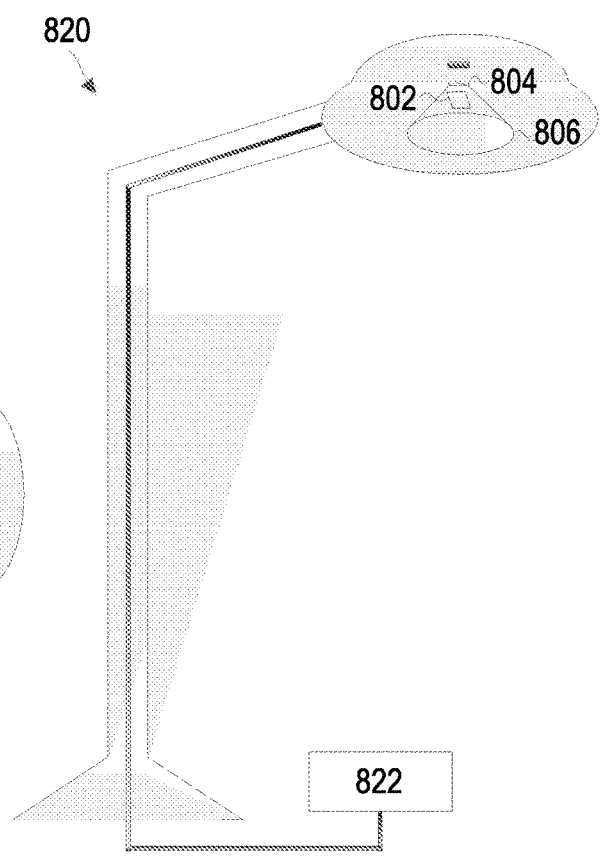

FIG. 8D is a side view illustration of a street light 820, which is another exemplary embodiment of an apparatus having the light-emitting device 802. The light-emitting device 802 may be located inside of the housing 806. The street light 820 may include a power source. In some exemplary embodiments, the power source may include a power generator 822. The power connection 804 may transfer power from the power source (e.g., the power generator 822) to the light-emitting device 802.

The inventions and methods described herein can be viewed as a whole, or as a number of separate inventions that can be used independently or mixed and matched as desired. All inventions, steps, processes, devices, and methods described herein can be mixed and matched as desired. All previously described features, functions, or inventions described herein or by reference may be mixed and matched as desired.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A light emitting diode (LED) package, comprising:
a substrate comprising aluminum nitride (AlN);
a patterned copper layer formed on a first side of the substrate, wherein the patterned copper layer comprises polished portions on a surface of the patterned copper layer opposite the substrate;
a first LED and a second LED disposed over the polished portions of the patterned copper layer;
a first cover comprising phosphor disposed over the first LED and a second cover comprising phosphor disposed over the second LED;
a silicone fill bordered by a first dam wall, a second dam wall, a first silicone fill surface, and a second silicone fill surface, wherein:
the silicone fill is formed in between the first dam wall and the second dam wall and in between the first and second LEDs,
the silicone fill does not extend over the first cover or the second cover,
the first silicone fill surface and respective ends of the first and second dam walls are substantially planar with a first end of the substrate, and
the first dam wall and the second dam wall comprise silicone.

2. A light emitting diode (LED) package, comprising:
a substrate comprising aluminum nitride (AlN);
a copper layer formed on a first side of the substrate, wherein the copper layer comprises polished portions on a surface of the copper layer opposite the substrate;
a gold layer formed on at least one polished portion of the copper layer;
an LED attached to the gold layer formed on the polished portion of the copper layer;
a cover disposed over and on the LED;
first and second silicone walls formed on two sides of the LED; and
a silicone fill formed in between the first and second silicone walls; and
wherein the silicone fill does not extend over the cover and the LED in a direction orthogonal to the first side of the substrate.

3. The LED package of claim 2, wherein the LED is attached to the gold layer using AuSn.

4. The LED package of claim 2, wherein the cover comprises phosphor and overhangs at least one side of the LED.

5. The LED package of claim 4,
wherein the silicone fill is formed in between at least two LEDs.

6. The LED package of claim 5, wherein the silicone fill disposed in between at least two LEDs has a height that is higher than the height of the two LEDs in a region between the two LEDs.

7. The LED package of claim 5, wherein the silicone fill disposed in between at least two LEDs has a height that is lower than the height of the two LEDs in a region between the two LEDs.

8. The LED package of claim 5, wherein the silicone fill disposed in between at least two LEDs has a height that is substantially the same as the height of the two LEDs in a region between the two LEDs.

9. The LED package of claim 2, further comprising a thermal pad disposed on a second side of the substrate.

10. The LED package of claim 2, further comprising a first thermal pad and a second thermal pad disposed on a second side of the substrate, wherein the first thermal pad and the second thermal pad are separated by a gap larger than 400 micrometer.

11. A light emitting diode (LED) package, comprising:
a substrate comprising aluminum nitride (AlN);
a patterned copper layer formed on a first side of the substrate, wherein the patterned copper layer comprises polished portions on a surface of the patterned copper layer opposite the substrate;
a gold layer formed on at least two polished portions of the patterned copper layer, wherein a first LED and a second LED are attached to the gold layer;
a first cover comprising phosphor disposed over the first LED and a second cover comprising phosphor disposed over the second LED, wherein the first cover overhangs at least one side of the first LED and the second cover overhangs at least one side of the second LED;
a silicone fill bordered by a first dam wall, a second dam wall, a first silicone fill surface, and a second silicone fill surface, wherein:
the silicone fill is formed in between the first dam wall and the second dam wall and in between the first and second LEDs,
the silicone fill does not extend over the first cover and the second cover,
the first silicone fill surface is substantially planar with a first end of the substrate and the second silicone fill surface is substantially planar with a second end of the substrate,
the first dam wall and the second dam wall comprise silicone.

12. A method of fabricating a light emitting diode (LED) package, comprising:
providing a substrate comprising aluminum nitride (AlN);
disposing a patterned copper layer on the substrate, wherein a portion of the patterned copper layer is polished;
disposing a first LED and a second LED on the polished portion of the patterned copper layer;
disposing a first cover on the first LED and a second cove on the second LED, wherein the first cover and the second cover comprise phosphor;
dispensing linearly a first dam wall and a second dam wall along opposite sides of the first LED and the second LED, wherein the first dam wall and the second dam wall comprise silicone;
dispensing a silicone fill in between the first dam wall and the second dam wall and in between the first LED and second LED; wherein the silicone fill does not extend over the first cover or the second cover;
forming a first silicone fill surface that is substantially planar with a first end of the substrate a first end of the first dam wall and a first end of the second dam wall by separating the LED package.

13. The method of claim 12, further comprising disposing a transient voltage suppression (TVS) chip to the patterned copper layer.

14. The method of claim 12, further comprising forming a gold layer on at least one polished portion of the patterned copper layer.

15. The method of claim 14 wherein the first LED and the second LED are disposed on the gold layer.

16. The method of claim 15 wherein the first LED and the second LED are attached to the gold layer using AuSn.

17. The method of claim 12 wherein the silicone fill is disposed in between the first LED and the second LED to a height that is higher than the height of the two LEDs in a region between the two LEDs.

18. The method of claim 12 wherein the silicone fill is disposed in between the first LED and the second LED to a height that is lower than the height of the two LEDs in a region between the two LEDs.

19. The method of claim 12 wherein the silicone fill is disposed in between the first LED and the second LED to a height that is substantially the same as the height of the two LEDs in a region between the two LEDs.

20. The method of claim 12, further comprising forming a thermal pad on a second side of the substrate.

* * * * *